(12) United States Patent
Honda et al.

(10) Patent No.: US 6,210,811 B1
(45) Date of Patent: Apr. 3, 2001

(54) EPOXY RESIN COMPOSITION, LAMINATE FILM USING THE SAME, AND SEMICONDUCTOR DEVICE

(75) Inventors: Tsuyoshi Honda; Miyuki Wakao, both of Gunma-ken (JP); Hisashi Shimizu, Selangor (MY); Toshio Shiobara, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/404,301

(22) Filed: Sep. 24, 1999

(30) Foreign Application Priority Data

Sep. 25, 1998 (JP) .................................................. 10-270834
Dec. 10, 1998 (JP) .................................................. 10-350932

(51) Int. Cl.⁷ .................................................... H01L 29/12
(52) U.S. Cl. .......................... 428/620; 523/466; 525/481; 525/487; 525/525; 525/526; 528/98; 528/117
(58) Field of Search ............................. 428/620; 523/466; 525/481, 487, 525, 526; 528/98, 117; 257/791, 793

(56) References Cited

U.S. PATENT DOCUMENTS 5,994,785 * 11/1999 Higuchi et al. ........................ 257/789

FOREIGN PATENT DOCUMENTS 10-335389    12/1998  (JP) .

OTHER PUBLICATIONS

Nitto Technical Report vol. 36, No. 1. May 1998, pp. 24–29.

* cited by examiner

*Primary Examiner*—Robert Dawson
*Assistant Examiner*—D. Aylward

(57) ABSTRACT

An epoxy resin composition comprising an epoxy resin containing 0–10% by weight of a 2-nucleus compound and 50–100% by weight of 3 to 5-nucleus compounds combined and having a dispersity (Mw/Mn) of 1.0–1.7, an inorganic filler, a curing catalyst, and optionally a phenolic resin, and having a Tg of lower than 15° C. in an uncured state is effective in forming a flexible film which is easy to work at room temperature. A laminate film includes a layer of the epoxy resin composition and a protective layer. By sealing a semiconductor chip with the film, there is obtained a semiconductor package having improved heat resistance, improved moisture resistance, low stress property.

8 Claims, 1 Drawing Sheet

EPOXY RESIN COMPOSITION, LAMINATE FILM USING THE SAME, AND SEMICONDUCTOR DEVICE

This invention relates to an epoxy resin composition of self-polymerization type or phenolic curing type, a laminate film using the same and suited for semiconductor packaging, and a semiconductor device sealed with the laminate film.

BACKGROUND OF THE INVENTION

The recent trend of electronic equipment is characterized by high speeds of size and weight reduction. Under the circumstances, it is desired to reduce the size and weight of semiconductor devices serving as the brain of electronic equipment. The ultimate target is to reduce the packaging area to the chip size, realizing a chip size package (CSP).

Epoxy resins are widely used in constructing semiconductor packages because of their good adhesion, heat resistance and moisture resistance. As the package system is diversified as mentioned above, epoxy resins are now used not only as the encapsulants well known in the art, but also as coating, die bonding and under-filling materials. Most such materials are diluted with solvents or in paste form.

Of these, the solvent-diluted materials require an attention to carefully remove the solvent that volatilizes off on use, from the standpoints of the health maintenance and safety of workers, undesirably adding to the cost.

Coating materials are used in several ways. One proposed method is to cover the surface of a semiconductor chip solely with a thin film of an epoxy resin composition to effect sealing. It is also proposed to screen print an epoxy resin composition in paste form. These materials include paste-like epoxy resin compositions such as those of the acid anhydride curing type and the amine curing type which are well known in the art. Alternatively, these paste-like epoxy resin compositions may take the form of a film which has been converted to B-stage.

Most of the prior art die bonding and under-filling materials were paste-like epoxy resin compositions. Recently, films formed from paste-like die bonding materials are widely utilized. On use, a film is pressed against a lead frame or substrate, and a semiconductor chip is joined onto the film whereupon the film is cured. Most of these die bonding materials are epoxy resin compositions of the acid anhydride curing type and the amine curing type which are well known in the art.

These B-staged films are easier to handle than paste-like materials and provide a very promising system that contributes to the simplification of a semiconductor device assembling process. However, the epoxy resin compositions of the acid anhydride curing type and the amine curing type are insufficient in the storage of uncured compositions and the moisture resistance and high-temperature performance of cured compositions. They are unsatisfactory in directly covering the semiconductor chip surface with a thin film.

As compared with the epoxy resin compositions of the acid anhydride curing type and the amine curing type, epoxy resin compositions of the self-polymerization type, especially those using imidazoles as the curing catalyst, and epoxy resin compositions of the phenolic curing type are satisfactory in the storage of uncured compositions and the moisture resistance and high-temperature performance of cured compositions, but are difficult to control the progress of reaction and hence, to form B-staged (or semi-cured state) films. To obtain flexible, easy-to-work films, the softening point of an epoxy resin base and a phenolic resin curing agent must be lowered. Undesirably, this is done at the expense of the heat resistance of cured compositions.

An object of the invention is to provide an epoxy resin composition of the self-polymerization type or the phenolic curing type which has a low glass transition temperature in an uncured state while maintaining the heat resistance, moisture resistance and low stress of a cured composition. Another object of the invention is to provide a laminate film comprising a flexible, easy-to-work thin layer of the epoxy resin composition. A further object of the invention is to provide a semiconductor device in which the gap between a semiconductor chip and a substrate or the surface of a semiconductor chip is sealed with the laminate film.

SUMMARY OF THE INVENTION

We have found that an epoxy resin composition comprising an epoxy resin containing up to 10% by weight of a 2-nucleus (two-nucleus) compound and at least 50% by weight of 3 to 5-nucleus (five-nucleus) compounds combined and having a weight average molecular weight/number average molecular weight ratio (referred to as a dispersity, hereinafter) of up to 1.7, an inorganic filler, and a curing catalyst, and having a glass transition temperature (often abbreviated as Tg) of lower than 15° C. in an uncured state is effective in forming a film which is very easy to work at room temperature by virtue of its good elasticity and flexibility. This is especially true when the composition is of the self-polymerization type wherein an imidazole is used as the curing catalyst or when the composition is of the phenolic curing type wherein a phenolic resin having a Tg of lower than 15° C. and free of a monomer is added. By enclosing a semiconductor chip with the film, there is obtained a semiconductor device having improved heat resistance, improved moisture resistance, low stress property, and a minimized void content.

In a first aspect, the invention provides an epoxy resin composition of the self-polymerization type or phenolic curing type, comprising (A) an epoxy resin containing up to 10% by weight of a 2-nucleus compound and at least 50% by weight of 3 to 5-nucleus compounds combined and having a dispersity of up to 1.7, (B) an inorganic filler, (C) a curing catalyst, and optionally, (D) a phenolic resin. The epoxy resin composition in an uncured state has a glass transition temperature Tg of lower than 15° C.

When the phenolic resin (D) is omitted, the epoxy resin composition is of the self-polymerization type wherein the curing catalyst (C) is preferably an imidazole. When the phenolic resin (D) is included, the epoxy resin composition is of the phenolic curing type. The phenolic resin preferably has a glass transition temperature of lower than 15° C. and is free of a monomer. The epoxy resin composition may further contain (E) a copolymer obtained by reacting an aromatic polymer with an organopolysiloxane of the following compositional formula (1):

wherein R represents hydrogen, an amino, epoxy, hydroxyl or carboxyl-bearing monovalent hydrocarbon group or an alkoxy group, R' represents a substituted or unsubstituted monovalent hydrocarbon group, a is a positive number from 0.001 to 1, b is a positive number from 0.9 to 2, the sum of a and b is from 1 to 3, the number of silicon atoms in one molecule is from 2 to 1,000, and the number of functional groups R directly attached to silicon atoms in one molecule is at least 1. Further preferably, the epoxy resin composition in an uncured state has a volatile content of up to 0.1% by weight.

In a second aspect, the invention provides a laminate film comprising at least two layers, at least one layer being formed of the epoxy resin composition to a thickness of 20 to 150 μm.

In a third aspect, the invention provides a semiconductor device comprising a semiconductor chip having a surface sealed with the laminate film in a cured state.

BRIEF DESCRIPTION OF THE DRAWING

The only FIGURE.

DESCRIPTION OF THE PREFERRED EMBODIMENTS

Epoxy Resin

Figure 1:
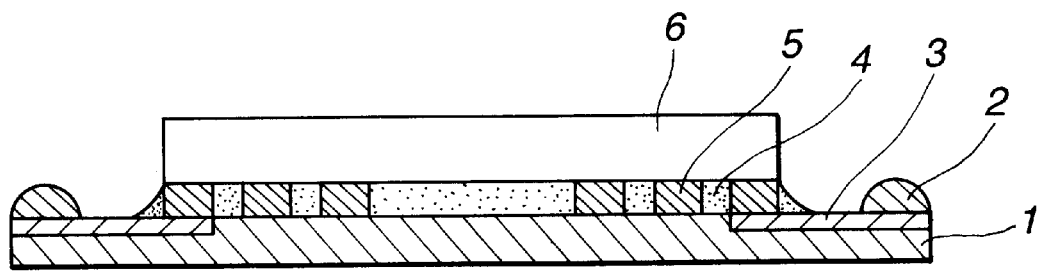
FIG. 1 illustrates in cross section a semiconductor package used in tests.

The epoxy resin used herein is any one of epoxy resins containing up to 10% by weight (i.e., 0 to 10% by weight) of a 2-nucleus (two-nucleus) or binuclear compound and at least 50% by weight (i.e., 50 to 100% by weight) of 3 to 5-nucleus (five-nucleus) compounds combined and having a dispersity of up to 1.7 (i.e., 1.0 to 1.7). The dispersity is defined as a weight average molecular weight divided by a number average molecular weight. Since the epoxy resin used herein has one epoxy group in each nucleus, an n-nucleus compound has n epoxy groups in one molecule.

Appropriate epoxy resins include novolac type epoxy resins represented by the following formula (2), such as phenol novolac type epoxy resins, cresol novolac type epoxy resins, and phenol and cresol co-condensed novolac type epoxy resins, and trishydroxyphenylalkane type epoxy resins represented by the following formula (3), such as trishydroxyphenylmethane type epoxy resins and trishydroxyphenylpropane type epoxy resins.

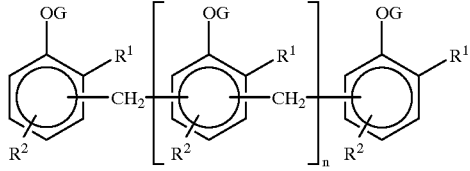

(2)

Herein, $R^1$ is hydrogen or methyl, $R^2$ is hydrogen or bromine, G is

and n is 0 or a natural number, preferably an integer of 0 to 5, more preferably 1, 2 or 3.

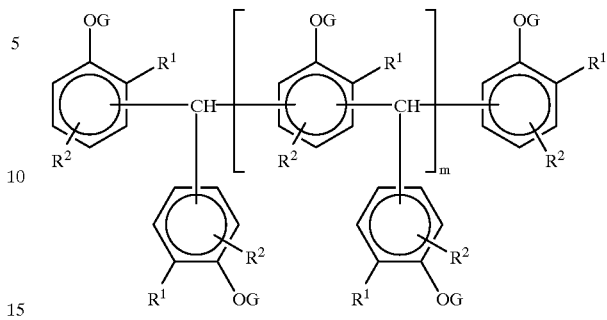

(3)

Herein, $R^1$ is hydrogen or methyl, $R^2$ is hydrogen or bromine, G is

and m is 0 or a natural number, preferably an integer of 0 to 5, more preferably 0 or 1.

Most preferred among these are those epoxy resins, especially phenol novolac type epoxy resins or cresol novolac type epoxy resins, in which the content of 3 to 5-nucleus compounds combined is at least 60% by weight (i.e., 60 to 100% by weight), the proportion of the 3-nucleus compound in the total amount of 3 to 5-nucleus compounds is at least 60% by weight (i.e., 60 to 100% by weight), the dispersity is up to 1.5 (i.e., 1.0 to 1.5), and the softening temperature is lower than 15° C., especially lower than 10° C. If the content of the 2-nucleus compound relative to the entire epoxy resin is too high, the cured composition has a lower Tg and poor heat resistance. Even within an appropriate content of the 2-nucleus compound, if the total amount of 3 to 5-nucleus compounds is too small, indicating a greater proportion of 6 or poly-nucleus compounds, the uncured composition has a higher Tg which deprives the film of its flexibility at room temperature, with a possibility of failure of the film.

In combination with the above-described epoxy resins, any conventional well-known epoxy resin may be used. Such conventional epoxy resins include bisphenol type epoxy resins such as bisphenol A type epoxy resins and bisphenol F type epoxy resins, biphenyl type epoxy resins, naphthalene type epoxy resins, cyclopentadiene type epoxy resins, phenol aralkyl type epoxy resins, and biphenyl aralkyl type epoxy resins. The conventional epoxy resin is blended with the above-described epoxy resin in such amounts that the resulting epoxy resin composition may have a Tg of lower than 15° C.

These epoxy resins should preferably have a total chlorine content of up to 1,500 ppm, more preferably up to 1,000 ppm. When chlorine extraction with water is effected at 120° C. and an epoxy resin concentration of 50% for 20 hours, the epoxy resins should preferably have an extracted chlorine content of up to 5 ppm. If the total chlorine content and the water extracted chlorine content are above the respective limits, the packaged semiconductor would have less reliable moisture resistance.

Filler

The inorganic filler used herein may be selected from various types of fillers depending on a particular application. Exemplary fillers include natural silicas such as crystalline silica and amorphous silica, synthetic high-purity silica, synthetic spherical silica, talc, mica, silicon nitride, boron nitride, alumina, and conductive particles such as silver powder, alone or in admixture of two or more. The shape of the inorganic filler is not critical, and spherical, ground and irregular shapes may be used, with the spherical one being preferred. An appropriate amount of the inorganic filler blended is about 50 to 1,000 parts, more preferably about 100 to 400 parts by weight per 100 parts by weight of the entire resin content (that is, the epoxy resin content plus the content of a phenolic resin and/or an aromatic polymer-organopolysiloxane copolymer to be described later, if blended).

The particle size of the inorganic filler is limited by the thickness of a laminate film. Desirably, the maximum particle size of the inorganic filler is less than the laminate film thickness, and the mean particle size is less than ½ of the laminate film thickness. Usually, the inorganic filler having a maximum particle size of less than 150 μm, preferably less than 75 μm, and a mean particle size of about 0.1 to 70 μm, more preferably about 1 to 30 μm is used. The mean particle size can be determined as a weight average value (or median diameter) by means of a particle size distribution meter using laser light diffractometry and similar analysis means.

Curing Catalyst

The epoxy resin composition may be formulated to either the self-polymerization where no curing agent is blended or the phenolic curing type where a phenolic resin is blended as the curing agent. In either case, the curing catalyst is blended as an essential component.

For the epoxy resin compositions of the self-polymerization type, any curing catalyst that allows the epoxy resin to polymerize by itself may be used without a need to limit its type. For example, imidazoles (i.e., imidazole compounds) and tertiary amines may be used alone or in admixture of two or more. Of these, imidazoles are desirable when the shelf stability of uncured compositions is taken into account. Exemplary imidazoles include 2-methylimidazole, 2-ethylimidazole, 2-ethyl-4-methylimidazole, 2-phenylimidazole, 2-phenyl-4-methylimidazole, 2-phenyl-4-hydroxymethylimidazole, and 2-phenyl-4,5-di(hydroxymethyl)imidazole. Exemplary tertiary amines include triethylamine, benzyldimethylamine, α-methylbenzyldimethylamine, as well as cycloamidines such as 1,8-diazabicyclo(5.4.0)undecene-7.

For the epoxy resin compositions of the phenolic curing type, organic phosphorus compounds may be used as the curing catalyst as well as the above-described imidazoles and tertiary amines. Exemplary organic phosphorus compounds include organic phosphine compounds and salts thereof such as triphenylphosphine, tributylphosphine, tri(p-toluyl)phosphine, tri(p-methoxyphenyl)phosphine, tri(p-ethoxyphenyl)phosphine, and triphenylphosphine-triphenyl borane, and quaternary phosphonium compounds and salts thereof such as tetraphenylphosphonium-tetraphenyl borate.

An appropriate amount of the curing catalyst blended is about 0.01 to 10 parts, more preferably about 0.1 to 5 parts by weight per 100 parts by weight of the epoxy resin (or the epoxy resin plus the phenolic resin, if the phenolic resin is blended). If the amount of the curing catalyst is too small, heat molding would result in undesirable undercure. Too large amounts of the curing catalyst can detract from the shelf stability.

Phenolic Resin

For the phenolic curing type epoxy resin composition, phenolic resins are blended as the curing agent.

Any phenolic resin having at least one phenolic hydroxyl group, preferably at least two phenolic hydroxyl groups in a molecule may be used herein. As opposed to the epoxy resin, the molecular weight distribution of the phenolic resin is not critical. In order that the (uncured) epoxy resin composition have a Tg of lower than 15° C., the phenolic resin should desirably have a Tg of lower than 15° C., especially lower than 10° C. Also, in order to avoid the cured composition from losing heat resistance, the phenolic resin should desirably be free of monomers (i.e., single-nucleus compounds). With these requirements taken into account, the preferred phenolic resins are those phenolic resins in which no monomers (i.e., single-nucleus compounds) are present, the total content of 2- to 4-nucleus compounds is at least 80% by weight (i.e., 80 to 100% by weight), the proportion of the 2-nucleus compound in the total content of 2 to 4-nucleus compounds is from 40% to less than 70% by weight, and Tg is lower than 15° C., especially lower than 10° C., and especially phenol novolac resins or cresol novolac resins of the following structural formula (4) satisfying these conditions.

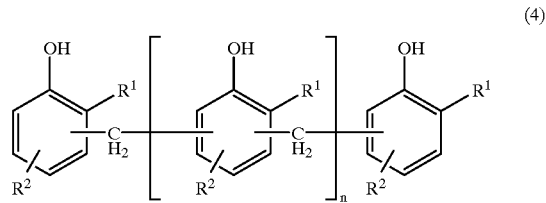

(4)

Herein $R^1$ is hydrogen or methyl, $R^2$ is hydrogen or bromine, n is 0 or a natural number, preferably an integer of 0 to 5, more preferably 0, 1 or 2. Since the phenolic resin used herein has one phenolic hydroxyl group in each nucleus, an n-nucleus compound has n phenolic hydroxyl groups in one molecule. If the proportion of the 2-nucleus compound in the total content of 2 to 4-nucleus compounds is more than 70% by weight, the cured composition would have a lower Tg and poor heat resistance. If the proportion of the 2-nucleus compound in the total content of 2 to 4-nucleus compounds is less than 40% by weight or the total content of 2 to 4-nucleus compounds is less than 80% by weight, indicating a greater proportion of 3- or poly-nucleus compounds, the uncured composition has a higher Tg which deprives the film of its flexibility at room temperature, with a possibility of failure of the film.

In combination with the above-described phenolic resins, any conventional well-known phenolic resin may be used within such an amount that the glass transition temperature of the epoxy resin composition does not become 15° C. or over. Such conventional phenolic resins include bisphenol type phenolic resins such as bisphenol A type resins and bisphenol F type resins, phenol and cresol co-condensed novolac resins, trishydroxyphenylalkane type resins such as trishydroxyphenylmethane type resins and trishydroxyphenylpropane type resins, naphthalene type phenolic resins, cyclopentadiene type phenolic resins, phenolaralkyl resins, and biphenylaralkyl type phenolic resins.

Desirably, the phenolic resin is blended with the epoxy resin in such amounts that the equivalent ratio of the phenolic resin to the epoxy resin (that is, the molar ratio of phenolic hydroxyl groups in the phenol resin to epoxy resins in the epoxy resin) may range from 0.5 to 2.0, more desirably from 0.8 to 1.2. If the phenolic resin is blended with the epoxy resin in such amounts that the equivalent ratio may be less than 0.5 or more than 2.0, then the resin composition would not fully cure and hence, lose heat resistance.

Various additives such as pigments (e.g., carbon black), dyes, flame retardants, coupling agents, and thermoplastic resins may be blended in the epoxy resin composition depending on its particular application.

The epoxy resin composition in an uncured state is soft and rubbery at room temperature (about 25° C.) and has a glass transition temperature (Tg) of lower than 15° C., preferably lower than 10° C. If the Tg of the uncured composition is 15° C. or higher, there is the risk that the film thereof is deprived of its flexibility at room temperature and thus fails.

Copolymer

In one preferred embodiment, a copolymer obtained by reacting an aromatic polymer with a specific organopolysiloxane is blended in the epoxy resin composition in order to improve the low stress property thereof.

The aromatic polymers used herein include a variety of compounds, for example, epoxy resins and phenolic resins of the following structural formulae (5) and (6).

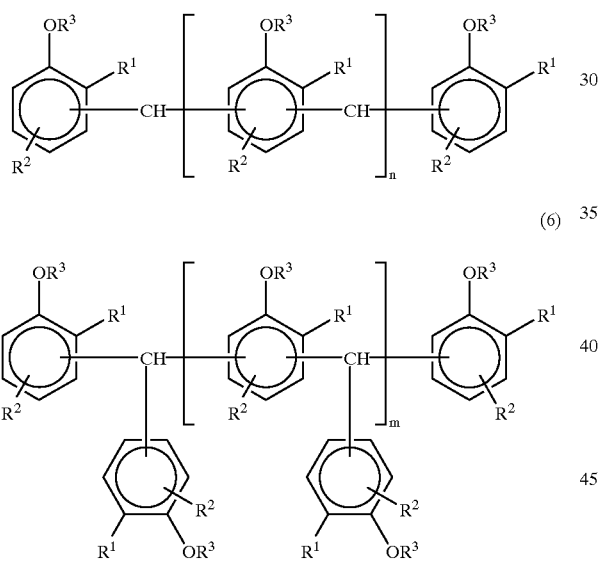

Herein, $R^1$ is hydrogen or methyl, $R^2$ is hydrogen or bromine, $R^3$ is hydrogen or

n is 0 or a natural number, preferably an integer of 0 to 50, more preferably an integer of 1 to 20, and m is 0 or a natural number, preferably an integer of 0 to 5, more preferably 0 or 1.

Other useful aromatic polymers are alkenyl group-bearing compounds (epoxy resins or phenolic resins) having the following structural formulae (7) to (9).

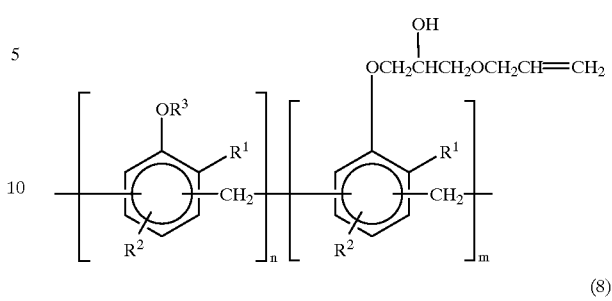

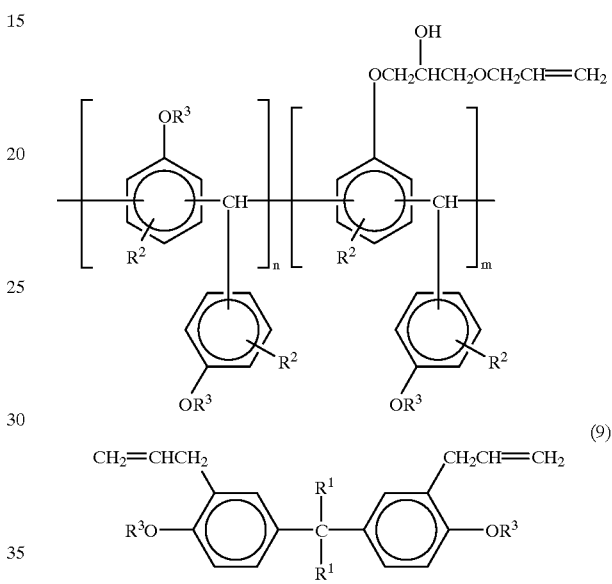

Herein, $R^1$ is hydrogen or methyl, $R^2$ is hydrogen or bromine, $R^3$ is hydrogen or

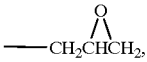

n and m are natural numbers, preferably the sum of n+m is from 2 to 50, more preferably from 2 to 20.

The organopolysiloxane is of the following compositional formula (1).

$$R_aR'_bSiO_{(4-a-b)/2} \tag{1}$$

Herein R represents hydrogen, an amino, epoxy, hydroxyl or carboxyl-bearing monovalent hydrocarbon group or an alkoxy group. R' represents a substituted or unsubstituted monovalent hydrocarbon group. The letters a and b are positive numbers satisfying $0.001 \leq a \leq 1$, $0.9b \leq 2$, and $1 \leq a+b \leq 3$. The number of silicon atoms in one molecule is from 2 to 1,000, preferably 10 to 400, and the number of functional groups R directly attached to silicon atoms in one molecule is at least 1, preferably 2 to 5, more prefereably 2. Differently stated, R is a functional group capable of reacting with epoxy, phenolic hydroxyl or alkenyl groups in the aromatic polymer to form a copolymer.

Of the groups represented by R, the amino-bearing monovalent hydrocarbon groups are exemplified by

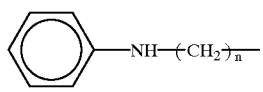

wherein n is an integer of 1 to 3; the epoxy-bearing monovalent hydrocarbon groups are exemplified by

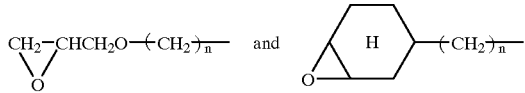

wherein n is an integer of 1 to 3; the hydroxy-bearing monovalent hydrocarbon groups are exemplified by

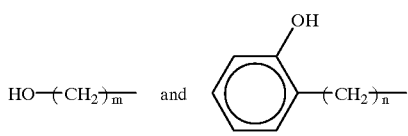

wherein m is an integer of 0 to 3 and n is an integer of 1 to 3; the carboxyl-bearing monovalent hydrocarbon groups are exemplified by $-C_xH_{2x}COOH$ wherein x is an integer of 0 to 10; and the alkoxy groups are exemplified by those of 1 to 4 carbon atoms such as methoxy, ethoxy, and n-propoxy.

The substituted or unsubstituted monovalent hydrocarbon groups represented by R' are preferably those of 1 to 10 carbon atoms, for example, alkyl groups such as methyl, ethyl, n-propyl, isopropyl, n-butyl, isobutyl, tert-butyl, pentyl, neopentyl, hexyl, cyclohexyl, octyl and decyl; alkenyl groups such as vinyl, allyl, propenyl and butenyl; aryl groups such as phenyl and tolyl; aralkyl groups such as benzyl and phenylethyl; and halo-substituted monovalent hydrocarbon groups obtained by substituting halogen atoms for some or all of the hydrogen atoms on the foregoing hydrocarbon groups. Among them, preferred are methyl group, ethyl group, propyl group and phenyl group.

Preferably, letters a and b satisfy $0.01 \leq a \leq 0.1$, $1.8 \leq b \leq 2$, and $1.85 \leq a+b \leq 2.1$, and the number of silicon atoms is from 10 to 400, more preferably from 20 to 210.

Illustrative examples of the organopolysiloxane are compounds of the following structures.

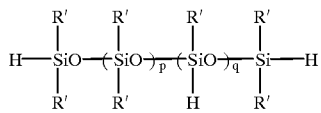

(10)

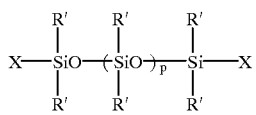

(11)

In formulae (10) and (11), R' represents a substituted or unsubstituted monovalent hydrocarbon group as in formula (1), preferably methyl or phenyl; X represents an amino, epoxy, hydroxyl or carboxyl-bearing monovalent hydrocarbon group; p is an integer of 0 to 1,000, preferably 8 to 400; and q is an integer of 0 to 20, preferably 0 to 5.

Specific examples are diorganopolysiloxane as given below.

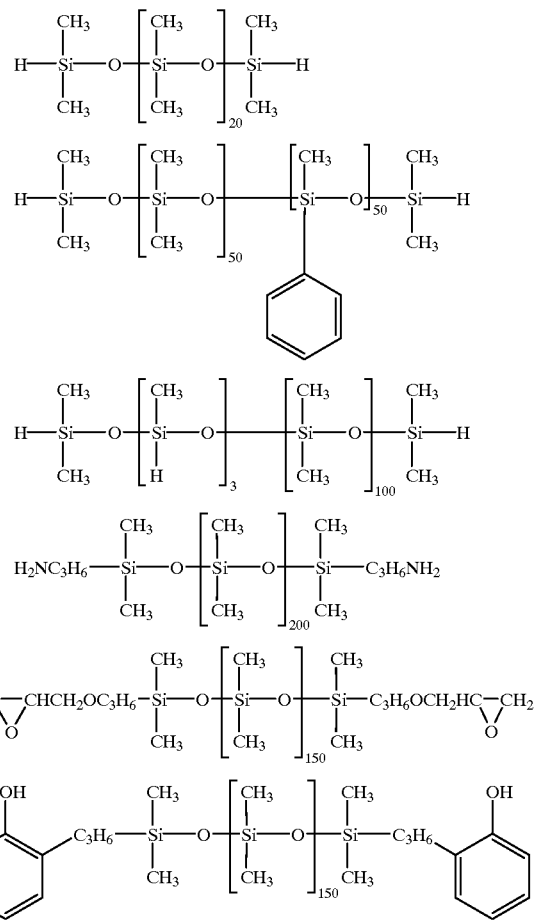

Desirably the organopolysiloxane has a molecular weight of 100 to 70,000 though not critical. When a copolymer obtained from an organopolysiloxane having a molecular weight of 100 to 70,000 is blended in an epoxy resin composition, the copolymer is not compatible with the matrix and rather forms a fine island-in-sea structure. If the molecular weight is less than 100, the resulting copolymer would become compatible with the matrix so that the island-in-sea structure disappears. If the molecular weight is greater than 70,000, an enlarged island-in-sea structure would form. In either case, the cured composition would lose the desired low stress property.

Any well-known method may be used in reacting the aromatic polymer with the organopolysiloxane to form a copolymer.

An appropriate amount of the copolymer blended is 0 to about 100 parts, more preferably about 1 to 50 parts by weight per 100 parts by weight of the epoxy resin (or the epoxy resin plus the phenolic resin, if the phenolic resin is blended). Especially for the phenolic curing type epoxy resin compositions, the ratio of the total content of phenolic hydroxyl groups to the total content of epoxy groups in the entirety of the epoxy resin, phenolic resin and copolymer is desirably from 0.5 to 2.0, more desirably from 0.8 to 1.2. If the total phenolic hydroxyl group content relative to the total epoxy group content is outside this range, the resin composition would not fully cure and hence, lose heat resistance.

The epoxy resin composition can be obtained by uniformly agitating and mixing the predetermined amounts of the above-described components, working the mixture in a roll mill, kneader or continuous kneader preheated at 70 to 90° C., cooling the mixture below its Tg, and grinding the mixture. The order of blending the components is not critical.

The epoxy resin composition is advantageously used in film form. As to the conditions under which the composition is heat molded into a film, the pressure applied to the composition is very low as compared with the transfer molding of conventional solid resins, and the composition has a more chance to be abruptly exposed to high temperatures as compared with the potting and under-filling of liquid materials. Therefore, volatile components in the uncured composition tend to be left as voids at the end of curing. It is thus desired to minimize the volatile content. Preferably, the volatile content is 0.1% by weight or lower, and more preferably 0.01% by weight or lower.

The epoxy resin composition of the invention is effectively used in semiconductor packaging, preferably after the composition is formed into a film. More preferably, a laminate film comprising at least two layers is contemplated wherein the epoxy resin composition is used as at least one layer thereof. The film or layer made of the epoxy resin composition preferably has a thickness of 20 to 150 $\mu$m. The material and thickness of the remaining layers are selected in accordance with the particular application of the laminate film.

One specific example is a laminate film consisting of a layer of the epoxy resin composition and a protective sheet which is bonded to one surface or each surface of the layer for the purpose of protecting the layer, examples of the protective sheet being a silicone sheet, Teflon® sheet, or polyethylene terephthalate (PET) sheet having parting silicone or Teflon® coated on its surface. Another exemplary laminate film has a layer of adhesive between the layer of the epoxy resin composition and the protective sheet or sheets, the adhesive layer serving to providing a quick bond to a substrate or semiconductor chip at room temperature.

The laminate film is manufactured by means of a coater/laminator as used in the manufacture of conventional rubber sheets. More specifically, the epoxy resin composition is stretched under heat and pressure, cut into strips or sliced into tapes (which are wound) depending on the particular application of the laminate film. Depending on the application, the strip or tape is further cut to the desired shape, which is used after the protective sheet is removed.

The laminate film is applicable to any semiconductor device although it is advantageously applied to small, thin semiconductor devices such as CSP. The laminate film is effective in establishing a bond in the narrow gap between a chip and a substrate. As compared with conventional acid anhydride curing type or amine curing type compositions, the inventive composition is effective in forming a reliable bond. The manner of using the laminate film is not critical. One typical procedure involves cutting the laminate film to a suitable size, moderately pressing the film to a substrate, mounting a chip on the film, and applying heat and pressure to the assembly (or effecting thermocompression). The film may be preheated before the mounting of the chip.

There has been described an epoxy resin composition in which the molecular weight distribution of the epoxy resin (and preferably the phenolic resin curing agent) is controlled so that the Tg of the uncured composition may be made low without sacrificing the heat resistance and moisture resistance of the cured composition. Using the epoxy resin composition, there is obtained a film which is flexible and easy to work. There is also obtained a laminate film comprising at least one layer of the epoxy resin composition and optionally at least one layer of another material. By enclosing a semiconductor chip with the film, a semiconductor package having improved heat resistance, moisture resistance and low stress property is obtained.

EXAMPLE

Examples of the invention are given below by way of illustration and not by way of limitation. Mw is a weight average molecular weight, Mn is a number average molecular weight, and Tg is a glass transition temperature.

Examples & Comparative Examples

Epoxy resins A to F having a molecular weight distribution, epoxy equivalent, and Tg as shown in Table 1, phenolic resins A to D having a molecular weight distribution, phenolic hydroxyl equivalent, and Tg as shown in Table 2, an inorganic filler (spherical silica having a maximum particle size of less than 24 $\mu$m and a mean particle size of 4 $\mu$m), 2-phenylimidazole (2PZ) and triphenylphosphine (TPP) curing catalysts, a silane coupling agent ($\gamma$-glycidoxypropyltrimethoxysilane, KBM403, Shin-Etsu Chemical Co., Ltd.), and a copolymer of the formula shown below (aromatic polymer-organopolysiloxane copolymer having an epoxy equivalent of 291 and a siloxane content of 31.2% by weight) were blended as shown in Tables 3 and 4. The blends were uniformly melt milled in a hot twin-roll mill, yielding epoxy resin compositions. It is noted that the epoxy resin, phenolic resin and copolymer were blended in such amounts as to provide an epoxy group/phenolic hydroxyl group ratio of 1/1 (molar ratio) and a polysiloxane content of 8% by weight based on the entire resin components.

Comparative Examples 6 and 7 used a liquid bisphenol A type epoxy resin (epoxy resin G, epoxy equivalent 179) as the epoxy resin. The curing agent was 4,4'-diaminodiphenylmethane (DDM, equivalent 99) in Comparative Example 6 and 4-methyltetrahydrophthalic anhydride (4-MTHPA, equivalent 166) in Comparative Example 7. They were blended in a formulation as shown in Table 5 (such that the functional groups might be equal in equivalent). The resulting epoxy resin compositions were B-staged at about 60° C. so as to have a Tg as shown in Table 5 before they were formed into films or otherwise worked.

Copolymer

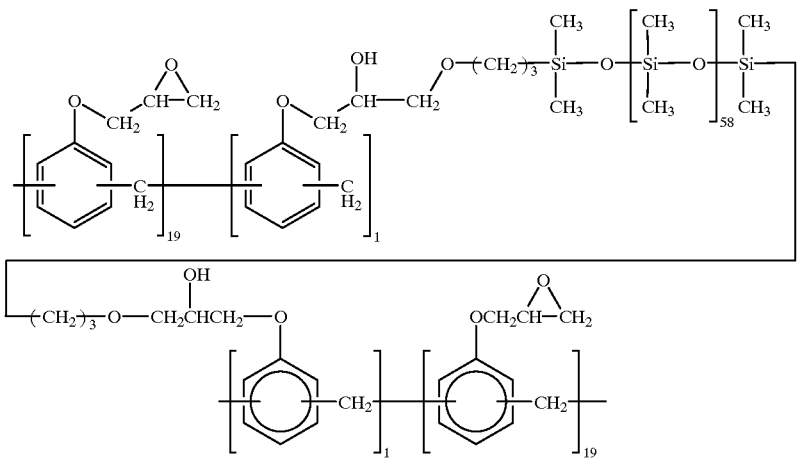

TABLE 1

Molecular weight distribution, epoxy equivalent, Tg of epoxy resin

|   | 2-nucleus | 3-nucleus | 4-nucleus | 5-nucleus | 6 and poly-nucleus | Mw/Mn | Epoxy equivalent | Tg (° C.) |
|---|---|---|---|---|---|---|---|---|
| A | 9 | 40 | 13 | 9 | 29 | 1.5 | 187 | 9 |
| B | 10 | 32 | 13 | 10 | 35 | 1.7 | 190 | 11 |
| C | 13 | 13 | 12 | 10 | 52 | 2.1 | 199 | 13 |
| D | 4 | 7 | 29 | 12 | 48 | 1.7 | 191 | 25 |
| E | 9 | 38 | 12 | 9 | 32 | 1.6 | 180 | 8 |
| F | — | 52 | — | 19 | 29 | 1.7 | 164 | 11 |

A to D: cresol novolac type epoxy resins
E: phenol novolac type epoxy resin
F: trishydroxyphenylmethane type epoxy resin
Unit: % by weight for 2 to 5-nucleus compounds and 6 and poly-nucleus compounds

TABLE 2

Molecular weight distribution, phenol equivalent, Tg of phenolic resin

|   | 2-nucleus | 3-nucleus | 4-nucleus | 5 and poly-nucleus | Mw/Mn | Phenol equivalent | Tg (° C.) |
|---|---|---|---|---|---|---|---|
| A | 60 | 28 | 9 | 3 | 1.2 | 110 | 9 |
| B | 35 | 29 | 17 | 19 | 1.4 | 112 | 14 |
| C | 6 | 25 | 25 | 44 | 1.2 | 113 | 22 |
| D | 37 | 27 | 16 | 20 | 1.3 | 110 | 8 |

A to C: cresol novolac resins
D: phenol novolac resin
Unit: % by weight for 2 to 4-nucleus compounds and 5 and poly-nucleus compounds These epoxy resin compositions were examined by the following tests (a) to (h). The results are shown in Tables 3 to 5.
(a) Tg of uncured composition
By differential scanning colorimetry (DSC), 10 mg of an uncured composition was heated at a rate of 5° C./min and the maximum of specific heat was measured.
(b) Film handling
An uncured composition was formed into film strips of 10 mm×50 mm×0.1 mm. Each strip was folded at 25° C. such that the short sides (10 mm) coincided with each other. The number of broken strips was reported per the total number of tested strips.
(c) Tg of cured composition
A composition was molded at 150° C. and 50 kgf/cm² for 3 minutes into a specimen of 5 mm×5 mm×15 mm, which was postcured at 150° C. for 4 hours. Tg was measured by means of TMA (Thermal Mechanical Analysis) by heating the specimen at a rate of 5° C./min.
(d) Moisture resistance
A semiconductor package as shown in FIG. 1 was allowed to stand for 24 and 48 hours in an atmosphere of 121° C., RH 100% and 2 atm. Some package samples showed abnormal values because of line disconnection. The number of failed samples per the total number of tested samples is reported.
(e) Water absorption
A composition was molded at 150° C. and 50 kgf/cm² for 3 minutes into a disk having a diameter of 50 mm and a thickness of 3 mm, which was postcured at 150° C. for 4 hours. The disk was allowed to stand for 24 hours in an atmosphere of 121° C., RH 100% and 2 atm. A weight change was determined.
(f) Solder cracking resistance after moisture absorption
A semiconductor package as shown in FIG. 1 was allowed to stand for 24 hours in an atmosphere of 121° C., RH 100% and 2 atm. It was immersed for 10 seconds in a solder bath at 240° C. The number of cracked samples per the total number of tested samples is reported.
(g) Volatile content of uncured composition
After 5 g of an uncured composition was heated at 180° C. for one hour, a weight change was determined.
(h) Voids of cured composition
Using an ultrasonic flaw detector, a semiconductor package as shown in FIG. 1 was inspected to determine the void area per the total area of the package.
Referring to FIG. 1, there is illustrated a semiconductor device package comprising a BT substrate 1, gold terminals 2, copper leads 3, an epoxy resin composition film 4, solder bumps 5, and a silicon chip 6. The epoxy resin composition film of 10 mm×10 mm×0.1 mm was placed on the BT substrate, moderately pressed thereto, and preheated at 120° C. for 10 seconds. The silicon chip of 10 mm×10 mm×0.3 mm having aluminum wiring and solder bumps formed thereon was positioned on the film. The film was heat molded at 180° C. and 10 kgf/cm² for 10 seconds and postcured at 150° C. for one hour, completing the semiconductor package.

TABLE 3

|  | E1 | E2 | E3 | E4 | CE1 | CE2 |
|---|---|---|---|---|---|---|
| Components (parts by weight) | | | | | | |
| Epoxy resin A | 74.4 | 0 | 0 | 0 | 0 | 0 |
| Epoxy resin B | 0 | 74.4 | 0 | 0 | 0 | 0 |
| Epoxy resin C | 0 | 0 | 0 | 0 | 74.4 | 0 |
| Epoxy resin D | 0 | 0 | 0 | 0 | 0 | 74.4 |
| Epoxy resin E | 0 | 0 | 74.4 | 0 | 0 | 0 |
| Epoxy resin F | 0 | 0 | 0 | 74.4 | 0 | 0 |
| Copolymer | 25.6 | 25.6 | 25.6 | 25.6 | 25.6 | 25.6 |
| Spherical silica | 300 | 300 | 300 | 300 | 300 | 300 |
| 2PZ | 2.0 | 2.0 | 2.0 | 2.0 | 2.0 | 2.0 |
| KBM403 | 1.0 | 1.0 | 1.0 | 1.0 | 1.0 | 1.0 |
| (a) Tg of uncured composition, °C. | 9 | 10 | 8 | 12 | 12 | 20 |
| (b) Film handling | 0/5 | 0/5 | 0/5 | 0/5 | 0/5 | 5/5 |
| (c) Tg of cured composition, °C. | 146 | 142 | 144 | 156 | 136 | — |
| (d) Moisture resistance | | | | | | |
| 24 hr. | 0/20 | 0/20 | 0/20 | 0/20 | 0/20 | — |
| 48 hr. | 0/20 | 0/20 | 0/20 | 0/20 | 0/20 | — |
| (e) Water absorption, % by weight | 0.66 | 0.68 | 0.69 | 0.68 | 0.72 | — |
| (f) Solder cracking resistance after moisture absorption | 0/20 | 0/20 | 0/20 | 0/20 | 2/20 | — |
| (g) Volatile content of uncured composition, % by weight | 0.01 | 0.02 | 0.02 | 0.03 | 0.11 | — |
| (h) Voids of cured composition, area % (% by area) | 0.05 | 0.07 | 0.08 | 0.12 | 0.50 | — |

TABLE 4

|  | E5 | E6 | E7 | E8 | E9 | E10 |
|---|---|---|---|---|---|---|
| Components (parts by weight) | | | | | | |
| Epoxy resin A | 40.8 | 40.4 | 0 | 0 | 0 | 0 |
| Epoxy resin B | 0 | 0 | 41.0 | 40.6 | 0 | 0 |
| Epoxy resin E | 0 | 0 | 0 | 0 | 40.2 | 0 |
| Epoxy resin F | 0 | 0 | 0 | 0 | 0 | 40.8 |
| Phenolic resin A | 33.6 | 0 | 33.4 | 0 | 0 | 0 |
| Phenolic resin B | 0 | 34.0 | 0 | 33.8 | 0 | 0 |
| Phenolic resin D | 0 | 0 | 0 | 0 | 34.2 | 33.6 |
| Copolymer | 25.6 | 25.6 | 25.6 | 25.6 | 25.6 | 25.6 |
| Spherical silica | 300 | 300 | 300 | 300 | 300 | 300 |
| TPP | 1.2 | 1.2 | 1.2 | 1.2 | 1.2 | 1.2 |
| KBM403 | 1.0 | 1.0 | 1.0 | 1.0 | 1.0 | 1.0 |
| (a) Tg of uncured composition, °C. | 9 | 11 | 10 | 13 | 9 | 11 |
| (b) Film handling | 0/5 | 0/5 | 0/5 | 0/5 | 0/5 | 0/5 |
| (c) Tg of cured composition, °C. | 132 | 131 | 131 | 130 | 131 | 142 |
| (d) Moisture resistance | | | | | | |
| 24 hr. | 0/20 | 0/20 | 0/20 | 0/20 | 0/20 | 0/20 |
| 48 hr. | 0/20 | 0/20 | 0/20 | 0/20 | 0/20 | 0/20 |
| (e) Water absorption, % by weight | 0.61 | 0.60 | 0.60 | 0.61 | 0.66 | 0.68 |
| (f) Solder cracking resistance after moisture absorption | 0/20 | 0/20 | 0/20 | 0/20 | 0/20 | 0/20 |
| (g) Volatile content of uncured composition, % by weight | 0.01 | 0.03 | 0.02 | 0.03 | 0.07 | 0.05 |
| (h) Voids of cured composition, area % (% by area) | 0.05 | 0.12 | 0.07 | 0.10 | 0.20 | 0.15 |

TABLE 5

|  | CE3 | CE4 | CE5 | CE6 | CE7 |
|---|---|---|---|---|---|
| Components (parts by weight) | | | | | |
| Epoxy resin A | 40.2 | 0 | 0 | 0 | 0 |
| Epoxy resin C | 0 | 41.7 | 0 | 0 | 0 |
| Epoxy resin D | 0 | 0 | 41.1 | 0 | 0 |
| Epoxy resin G | 0 | 0 | 0 | 42.3 | 31.0 |
| Phenolic resin A | 0 | 32.7 | 33.3 | 0 | 0 |
| Phenolic resin C | 34.2 | 0 | 0 | 0 | 0 |
| DDM | 0 | 0 | 0 | 32.1 | 0 |
| 4-MTHPA | 0 | 0 | 0 | 0 | 43.4 |
| Copolymer | 25.6 | 25.6 | 25.6 | 25.6 | 25.6 |
| Spherical silica | 300 | 300 | 300 | 300 | 300 |
| TPP | 1.0 | 1.0 | 1.0 | 0 | 0 |
| KBM403 | 1.0 | 1.0 | 1.0 | 1.0 | 1.0 |
| (a) Tg of uncured composition, °C. | 15 | 11 | 16 | 10 | 9 |
| (b) Film handling | 5/5 | 0/5 | 5/5 | 0/5 | 0/5 |
| (c) Tg of cured composition, °C. | — | 115 | — | 158 | 121 |
| (d) Moisture resistance | | | | | |
| 24 hr. | — | 0/20 | — | 12/20 | 9/20 |
| 48 hr. | — | 0/20 | — | 20/20 | 20/20 |
| (e) Water absorption, % by weight | — | 0.61 | — | 1.10 | 1.03 |
| (f) Solder cracking resistance after moisture absorption | — | 2/20 | — | 0/20 | 0/20 |
| (g) Volatile content of uncured composition, % by weight | — | 0.12 | — | 0.45 | 0.40 |
| (h) Voids of cured composition, area % (% by area) | — | 0.5 | — | 10 | 9 |

Japanese Patent Application Nos. 10-270834 and 10-350932 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An epoxy resin composition comprising
   (A) an epoxy resin containing up to 10% by weight of a 2-nucleus compound and at least 50% by weight of 3 to 5-nucleus compounds combined and having a dispersity of up to 1.7,
   (B) an inorganic filler, and
   (C) a curing catalyst,
said epoxy resin composition in an uncured state having a glass transition temperature of lower than 15° C.

2. The epoxy resin composition of claim 1 wherein the curing catalyst (C) is an imidazole compound.

3. The epoxy resin composition of claim 1 further comprising (D) a phenolic resin.

4. The epoxy resin composition of claim 3 wherein the phenolic resin (D) has a glass transition temperature of lower than 15° C. and is free of a monomer.

5. The epoxy resin composition of claim 1 further comprising (E) a copolymer obtained by reacting an aromatic polymer with an organopolysiloxane of the following compositional formula (1):

$$R_a R'_b SiO_{(4-a-b)/2} \tag{1}$$

wherein R represents hydrogen, an amino, epoxy, hydroxyl or carboxyl-bearing monovalent hydrocarbon group or an alkoxy group, R' represents a substituted or unsubstituted monovalent hydrocarbon group, a is a positive number from 0.001 to 1, b is a positive number from 0.9 to 2, the sum of a and b is from 1 to 3, the number of silicon atoms in one molecule is from 2 to 1,000, and the number of functional groups R directly attached to silicon atoms in one molecule is at least 1.

6. The epoxy resin composition of claim 1 which in an uncured state has a volatile content of up to 0.1% by weight.

7. A laminate film comprising at least two layers, at least one layer being formed of the epoxy resin composition of any one of claims 1 to 6 to a thickness of 20 to 150 μm.

8. A semiconductor device comprising a semiconductor chip having a surface sealed with the laminate film of claim 7 in a cured state.

* * * * *